(12) United States Patent
Khayat et al.

(10) Patent No.: US 11,797,205 B2
(45) Date of Patent: Oct. 24, 2023

(54) MEASUREMENT OF REPRESENTATIVE CHARGE LOSS IN A BLOCK TO DETERMINE CHARGE LOSS STATE

(71) Applicant: Micron Technology, Inc., Boise, ID (US)

(72) Inventors: Patrick R. Khayat, San Diego, CA (US); Steven Michael Kientz, Westminster, CO (US); Sivagnanam Parthasarathy, Carlsbad, CA (US); Mustafa N. Kaynak, San Diego, CA (US); Vamsi Pavan Rayaprolu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 64 days.

(21) Appl. No.: 17/675,624

(22) Filed: Feb. 18, 2022

(65) Prior Publication Data

US 2023/0266901 A1   Aug. 24, 2023

(51) Int. Cl.
G06F 3/06 (2006.01)

(52) U.S. Cl.
CPC ............ *G06F 3/064* (2013.01); *G06F 3/0625* (2013.01); *G06F 3/0679* (2013.01)

(58) Field of Classification Search
None
See application file for complete search history.

(56) References Cited

U.S. PATENT DOCUMENTS

| 2009/0052269 | A1* | 2/2009 | Moschiano | G11C 16/10 365/230.03 |
| 2009/0268520 | A1* | 10/2009 | Roohparvar | G11C 27/005 365/185.09 |
| 2016/0372199 | A1* | 12/2016 | Shim | G11C 16/26 |
| 2022/0076760 | A1* | 3/2022 | Kaynak | G11C 16/349 |
| 2022/0237094 | A1* | 7/2022 | Sheperek | G06F 3/0634 |
| 2023/0057614 | A1* | 2/2023 | Benson | G11C 7/04 |

* cited by examiner

Primary Examiner — Kevin Verbrugge
(74) Attorney, Agent, or Firm — Lowenstein Sander LLP

(57) ABSTRACT

A processing device in a memory sub-system detects an occurrence of a triggering event, determines respective levels of charge loss associated with a first representative wordline of a block of a memory device and with a second representative wordline of the block of the memory device, and determines whether a difference between the respective levels of charge loss satisfies a threshold criterion. Responsive to determining that the difference between the respective levels of charge loss satisfies the threshold criterion, the processing device further determines that the block is in a uniform charge loss state.

20 Claims, 8 Drawing Sheets

MEASUREMENT OF REPRESENTATIVE CHARGE LOSS IN A BLOCK TO DETERMINE CHARGE LOSS STATE

TECHNICAL FIELD

Embodiments of the disclosure relate generally to memory sub-systems, and more specifically, relate to measurement of representative charge loss in a block to determine charge loss state in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
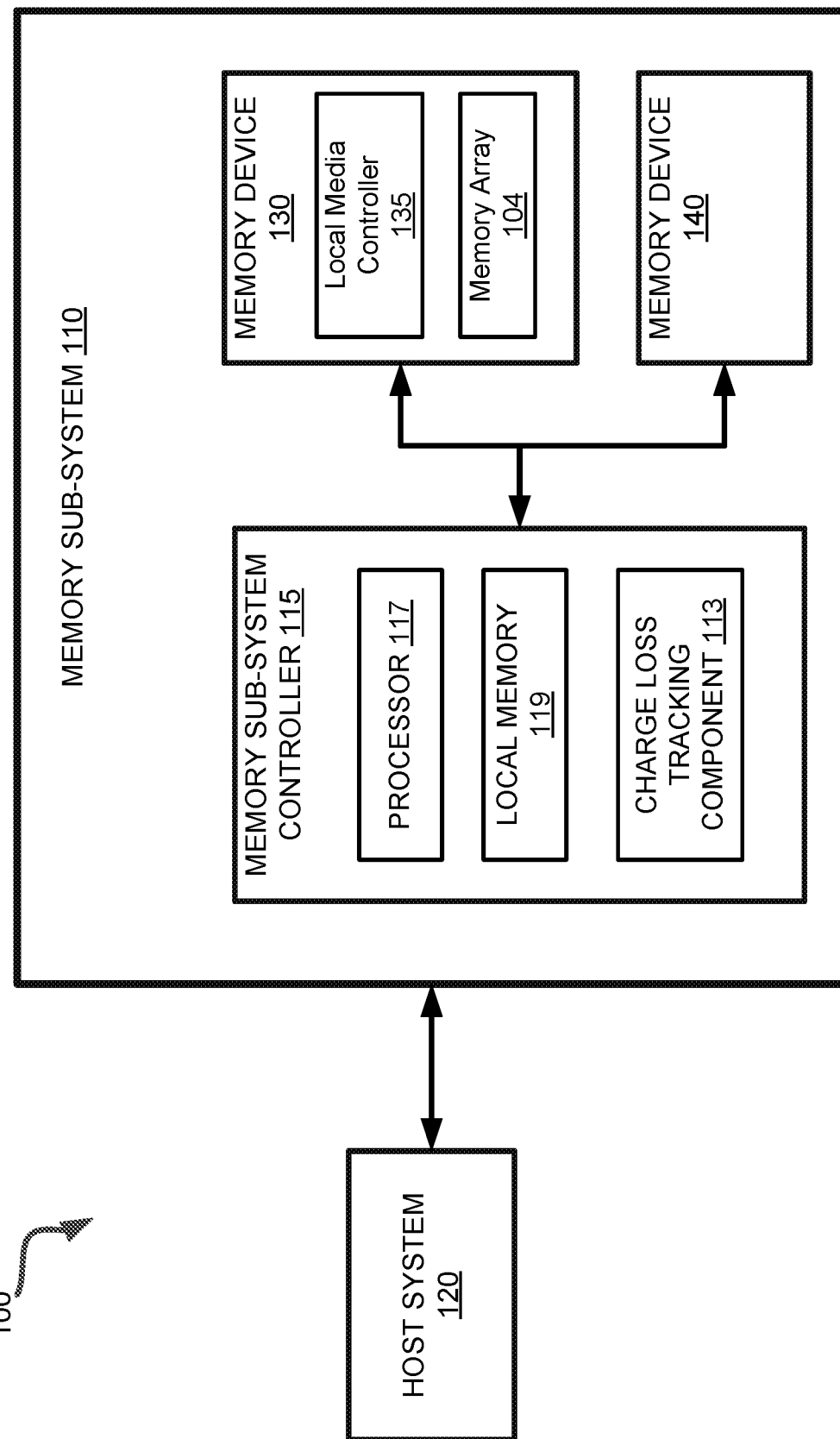
FIG. 1 illustrates an example computing system that includes a memory sub-system in accordance with some embodiments of the present disclosure.

Aspects of the present disclosure are directed to measurement of representative charge loss in a block to determine charge loss state in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

One example of a memory sub-system is a solid-state drive (SSD) that includes one or more non-volatile memory devices and a memory sub-system controller to manage the non-volatile memory devices. A given segment of one of those memory devices (e.g., a block) can be characterized based on the programming state of the memory cells associated with wordlines contained within the segment. For example, an open block can refer to a block in which some of the wordlines have associated memory cells which have been programed, but other wordlines have associated memory cells which are not currently programmed (e.g., are in an erase state). A closed block can refer to a block in which all of the wordlines have associated memory cells which have been programmed. A block can also be characterized based on age, which can be defined in view of a number of program/erase (P/E) cycles that have been performed with respect to the block. For example, a cycled block can refer to a block that has undergone a number of P/E cycles that exceeds a first threshold number of P/E cycles (e.g., an older block), and a fresh block can refer to a block that has undergone a number of P/E cycles less than a second threshold number of P/E cycles (e.g., a newer block).

One phenomenon observed in memory devices is VT distribution shift, also referred to herein as temporal voltage shift (TVS). For example, with respect to programmed pages of a block, charge loss, such as storage charge loss (SCL), intrinsic charge loss (ICL), quick charge loss (QCL), or lateral charge loss (LCL), can cause VT distributions of the programmed pages to shift towards lower voltages as charge diminishes over time and/or with respect to changes in temperature. That is, the charge loss and the corresponding VT distribution shift towards lower voltages can be proportional to amount of time elapsed data was programmed. Conversely, with respect to erased pages (e.g., erased pages of partially programmed blocks), charge gain can cause VT distributions of the erased pages to shift towards higher voltages.

A variety of different detection techniques can be used to detect charge loss and/or charge gain. One example of a detection technique that can be used to detect charge loss or charge gain is a block-level detection technique. During a block-level detection technique, a controller can initiate a block-level read. The controller can then obtain a block-level voltage measurement during the block-level read (e.g., a highest voltage level in the block), determine an amount of charge loss from the block-level voltage measurement, and apply a set of appropriate read level offsets to address the charge loss.

One example of a block-level detection technique is dynamic pass-through voltage ($V_{pass}R$). During a read operation of a cell (i.e. a "read cell"), a read reference voltage ($V_{ref}$) can be applied to an associated wordline, and a sense amplifier connected to an associated bitline can be used to sense whether the read cell has been switched on. More specifically, if $V_{ref}$ is higher than a threshold voltage ($V_T$) of the read cell, then the read cell is turned on. It is noted that only one cell per bitline can be read at a time. Since the cells of a bitline are connected in series, all transistors for cells of the bitline that are not being read ("unread cells") need to be kept on during the read operation in order for the read output of the read cell to pass-through to the sense amplifier. To achieve this, $V_{pass}R$ can be applied to the wordlines of the unread cells to keep the unread cells activated (i.e., turned on). The magnitude of $V_{pass}R$ is chosen to be greater than the $V_T$'s of the unread cells, but less than a programming voltage. Although $V_{pass}R$ is a lower voltage than the programming voltage, the application of $V_{pass}R$ can affect (e.g., increase) the $V_T$'s and thus alter logic states of the unread cells of the block via tunneling currents. This phenomenon is referred to as "read disturb." As more read operations are applied within the block, the accumulation of read disturb over time lead to read disturb errors.

During dynamic $V_{pass}R$, all wordlines can be ramped up together and a current (e.g., pillar current) can be measured at a power supply voltage (e.g., $V_{REG2}$) until the current is larger than some threshold current value. The $V_T$ of cells connected to a selected wordline ($WL_{sel}$) can be detected directly. For example, cells connected to the unselected wordlines ($WL_{unsel}$) can be ramped to $V_{pass}R$. Then, the cells connected to $WL_{sel}$ can be ramped down to a lower voltage to detect the $V_T$ of those cells. SCL can then be detected if a lower magnitude wordline voltage is needed to meet the threshold current value.

In some instances, a block can be a homogeneously written block. A homogeneously written block refers to a block in which the memory cells associated with the first wordline of the block to be written and the memory cells associated the last wordline of the block to be written have approximately the same amount and/or rate of charge loss. For example, when the difference in the amount of time between the programming performed with respect to the first wordline of the block and the programming with respect to the last wordline of the block is sufficiently small, the block can be considered to be homogeneously written. Block-level detection techniques can be performed to detect charge loss on homogeneously written blocks, although will not work for partially written blocks.

In some instances, a block can be a mixed SCL block. In contrast to a homogeneously written block, a mixed SCL block refers to a block that exhibits variations in rates of charge loss among the programmed memory cells associated with different wordlines and/or variations in rates of charge gain among erased memory cells associated with different wordlines (e.g., cells associated with earlier programmed wordlines can exhibit greater charge loss than cells associated with more recently programmed wordlines). The variations observed in a mixed SCL block can be due to the block being open for a sufficiently long amount of time (e.g., greater than one hour). Such variations in charge loss and/or charge gain rates can lead to reduced memory device performance. For example, such variations can lead to poor trigger rates, and potential reliability concerns if there is too much charge gain with respect to the erased state $V_T$ distribution (e.g., L0). Therefore, it may not be possible to use a block-level detection technique to detect and address charge loss and/or charge gain with respect to a mixed SCL block. Moreover, other charge loss and/or charge gain detection techniques may negatively affect memory device performance and/or consume a large amount of memory sub-system resources. As such, when a read operation is performed on mixed SCL block, block-level read offset values may not adequately address the charge loss variations because of the memory cells in the block associated with different wordlines having experienced different levels and/or rates of charge loss.

Aspects of the present disclosure address the above and other issues by providing a number of methods to identify whether a block, or other segment of a memory device, has reached a uniform charge loss state. Due to the nature of the underlying media, even those memory cells programmed at different times will eventually reach a state where the levels and/or rates of charge loss become uniform, or approximately uniform, after a certain amount of time. That amount of time, however, is impacted by the temperature experienced by those memory cells. For example, if the temperature increases, the level and/or rate of charge loss can also proportionately increase. Similarly, if the temperature decreases, the level and/or rate of charge loss can also proportionately decrease.

In some embodiments, the memory sub-system utilizes a temperature-compensated time estimate for when a block will reach the uniform charge loss state. The memory sub-system controller can monitor the temperature experienced by the memory device during a period of time when the block is open (i.e., after data is written to memory cells associated with a first wordline of the block and before data is written to memory cells associated with a last wordline of the block.) Depending on that temperature, the memory sub-system controller can increment a timer/counter by a normalized amount representing an amount of time associated with the average temperature while the block is open. Once the block is closed (i.e., when data is written to the memory cells associated with the last wordline of the block), the memory sub-system controller can use the value of the timer/counter, which has been normalized to account for temperature, and a predetermined scaling factor to determine an estimate of when the block will reach the uniform charge loss state. When a request to read the block is received, the memory sub-system controller can compare the current time to the estimate to determine whether the block is in the uniform charge loss state. If the current time is greater than the estimate, the block can be considered to be in the uniform charge loss state and a corresponding technique can be used to account for the charge loss when performing the read operation. Conversely, if the current time is less than the estimate, the block can be considered to be in the mixed SCL state and different techniques can be used to account for the charge loss when performing the read operation.

In other embodiments, the memory sub-system measures representative charge loss in a block to determine whether the block has already reached the uniform charge loss state. In response to a triggering event, the memory sub-system controller can perform measurements of the level and/or rate of charge loss of the memory cells associated with two or more representative wordlines of the block. For example, a first representative charge loss can be that of the memory cells associated with the first wordline of the block to be written, and a second representative charge loss can be that of the memory cells associated with the last wordline of the block to be written. Depending on the implementation, the triggering event can be the expiration of a periodic interval, the occurrence of a power cycle event where at least one of the memory device of the memory sub-system temporarily loses power which is subsequently restored, or some other triggering event. If the memory sub-system controller determines that a difference between the representative charge losses satisfies a threshold criterion (e.g., is less than a threshold amount), the memory sub-system controller can determine that the block has reached the uniform charge loss state and can store an indication of the same in the system memory. Conversely, if the difference between the representative charge losses does not satisfy the threshold criterion (e.g., is greater than or equal to the threshold amount), the memory sub-system controller can determine that the block is still in the mixed SCL state and can store an indication of the same in the system memory. When a request to read the block is received, the memory sub-system controller can determine the state of the block from the system memory and use a corresponding technique to account for the charge loss when performing the read operation.

Advantages of the approaches described herein include, but are not limited to, improved performance in the memory sub-system. For example, by being able to predict when a block will reach the uniform charge loss state, or otherwise determine if the block has reached the uniform charge loss state, the memory sub-system controller can use appropriate techniques to account for charge loss when performing a read operation on that block. Thus, the memory sub-system controller will not be limited to using complex, time and resource intensive techniques unnecessarily once the uniform charge loss state is reached, which can result in lower read latency. In addition, the memory sub-system controller can gain the benefit of using those techniques while the block remains in the mixed SCL state, which will improve accuracy of the read operation, leading to fewer errors.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., one or more memory device(s) 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., the one or more memory device(s) 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory device(s) 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device(s) 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory device(s) 130. The memory sub-system controller 115 can further include host interface circuitry to communicate with the host system 120 via the physical host interface. The host interface circuitry can convert the commands received from the host system into command instructions to access the memory device(s) 130 as well as convert responses associated with the memory device(s) 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device(s) 130.

In some embodiments, the memory device(s) 130 include local media controllers 135 that operate in conjunction with memory sub-system controller 115 to execute operations on one or more memory cells of the memory device(s) 130. An external controller (e.g., memory sub-system controller 115) can externally manage the memory device 130 (e.g., perform media management operations on the memory device(s) 130). In some embodiments, a memory device 130 is a managed memory device, which is a raw memory device (e.g., memory array 104) having control logic (e.g., local controller 135) for media management within the same memory device package. An example of a managed memory device is a managed NAND (MNAND) device. Memory device(s) 130, for example, can each represent a single die having some control logic (e.g., local media controller 135) embodied thereon. In some embodiments, one or more components of memory sub-system 110 can be omitted.

In one embodiment, the memory sub-system 110 includes a charge loss tracking component 113 that can estimate and/or determine when/if a segment (e.g., a block) of memory array 104 of memory device 130 will reach or has reached a uniform charge loss state. The charge loss experienced by the segment can be attributable to any of storage charge loss (SCL), intrinsic charge loss (ICL), quick charge loss (QCL), or lateral charge loss (LCL), for example, In one embodiment, charge loss tracking component 113 can normalize the amount of time between block opening and block closing to account for the average write temperature, and apply a predetermined scaling factor to find an estimate of when the block with reach the uniform charge loss state. When the block is read, depending on whether the block is estimated to have reached that uniform charge loss state, different approaches for handling the charge loss (e.g., determining the read voltage offsets) can be utilized. In other embodiments, the time values associated with block opening and block closing are unavailable or inaccurate. Accordingly, in response to a triggering event, charge loss tracking component 113 can initiate measurements of the level of charge loss on two or more representative wordlines of the block (e.g., the first wordline written and the last wordline written). The triggering event can include the expiration of a periodic interval or a power cycle event, for example. If the difference between the measured levels of charge loss satisfies a threshold criterion (e.g., is less than a threshold amount), charge loss tracking component 113 can determine that the block is in a uniform charge loss state and can record an indication of that status in system memory (e.g., local memory 119) to be consulted later when a read operation is performed on the block. Further details with regards to the operations of charge loss tracking component 113 are described below.

Figure 2:
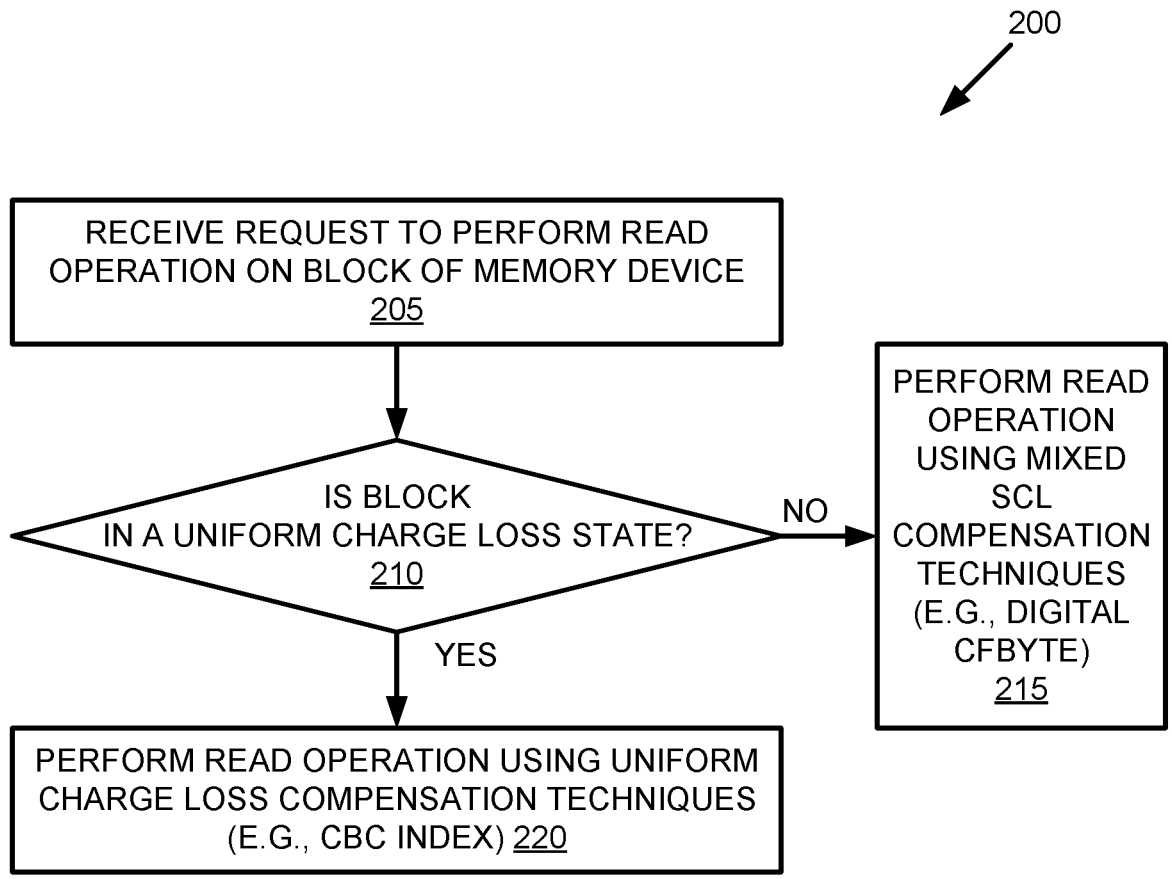
FIG. 2 is a flow diagram of an example method of processing a request to perform a read operation based on a determination of whether a block is in a uniform charge loss state in accordance with some embodiments of the present disclosure.

FIG. 2 is a flow diagram of an example method of processing a request to perform a read operation based on a determination of whether a block is in a uniform charge loss state in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by charge loss tracking component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the processing logic (e.g., charge loss tracking component 113) receives, from a requestor, a request to perform a read operation to read data from a memory device, such as memory device 130. In one embodiment, memory sub-system controller 115 receives the request from host system 120 or from some other component connected to or within memory sub-system 110. The request may identify data to be read from memory device 130 of memory sub-system 110, such as a particular page of data in a segment (e.g., a block) of memory device 130.

At operation 210, the processing logic determines whether the block to which the read operation is directed is in a uniform charge loss state. As described herein, a block, such as block 310 illustrated in FIG. 3, can be in the uniform charge loss state when memory cells associated with all of the wordlines in the block that have been programmed have the same, or approximately the same, level and/or rate of charge loss.

Figure 3:
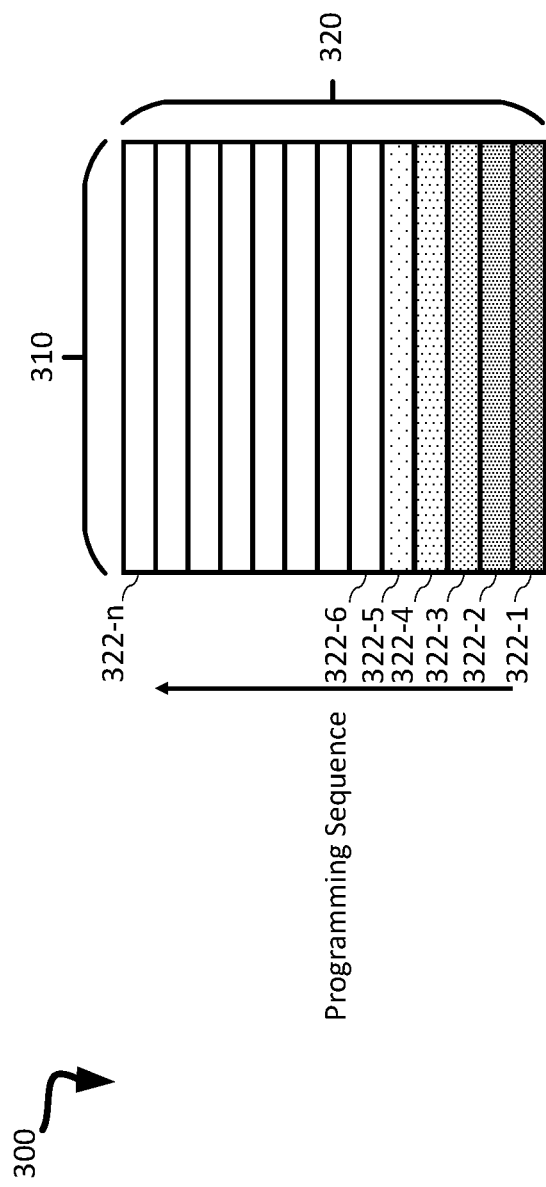
FIG. 3 is a diagram illustrating an example block of a memory device, in accordance with some embodiments of the present disclosure.

FIG. 3 is a diagram 300 illustrating an example block 310, in accordance with some embodiments of the present disclosure. For example, the block 310 can be a NAND block or can represent some other segment of memory device 130. As shown, the block 310 includes a number of individual portions (e.g., pages) 320, including pages 322-1 through 322-n. In one embodiment, the programming sequence proceeds from the bottom of block 310 to the top, as illustrated in diagram 300. Accordingly, page 322-1 can be associated with a first wordline to be programmed, while page 322-n can be associated with a last wordline to be programmed. If all of the pages 322-1 through 322-n have been programmed, block 300 can be considered to be "closed." If only a subset of the pages (e.g., one or more pages), such as pages 322-1 through 322-5 for example, have been programmed, block 300 can be considered to be "open." In the open block example above, pages 322-6 through 322-n can be in an erased state.

Block 310 can be in the uniform charge loss state the pages 320 of block 310 are homogeneously written, such that the memory cells associated with all of the wordlines are programmed within a sufficiently short period of time. In the case where page 322-n is programmed a significant amount of time (e.g., hours or days) after page 322-1, there can be significant differences in the levels and/or rates of charge loss experienced by pages 322-1 and 322-n. In addition, the intervening pages in block 310 can also have different levels and/or rates of charge loss. The uniform charge loss state can be reached in such a mixed SCL block (i.e., a block where the memory cells associated with different wordlines are written over a longer period of time) after the passage of a certain amount of time, as the charge loss of the memory cells associated with different wordlines will eventually converge to the same, or approximately the same, level and/or rate.

Referring again to FIG. 2, in order to determine whether the block to which the read operation is directed is in a uniform charge loss state at operation 210, depending on the embodiment, the processing logic can use either a temperature compensated amount of time for which the block 310 was open to predict when the block 310 will reach the uniform charge loss state, or can use measurements of representative charge loss associated with different wordlines to determine whether the block 310 is in the uniform charge loss state. Additional details with respect to using the temperature compensated time estimate are described below with respect to FIGS. 4-5. Additional details with respect to using the measurements or representative charge loss are described below with respect to FIGS. 6-7.

Responsive to determining that the block 310 is not in the uniform charge loss state, at operation 215, the processing logic can perform the read operation to read the requested data from block 310 using mixed SCL compensation techniques. In one embodiment, the mixed SCL compensation techniques includes the use of device-originated metadata, such as a digital failed byte count (CFByte), for adjusting read voltage offset levels used to perform the read operation. For example, charge loss tracking component 113 can utilize the memory device-originated metadata to select and/or adjust the read voltage level(s) used for each respective wordline of block 310 in a manner that would either minimize the read operation latency while providing at least a specified accuracy of the read operation, or in a manner that would maximize the read operation accuracy while not exceeding a specified latency. In one embodiment, a read strobe operation is performed on the block to identify memory cells having their respective threshold voltages below and/or above the applied read level. In one embodiment, the memory device 130 can, upon performing the read strobe, return metadata values, such as the failed byte count (CFByte) reflecting the number of bytes in the sensed data that have at least one non-conducting bitline. Charge loss tracking component 113, or another component of memory sub-system controller 115 can use the metadata values characterizing the threshold voltage distributions in order to determine the read voltage adjustment values, which can then be utilized for performing the next read strobe. After performing each read strobe, the processing logic can evaluate a chosen data state metric (e.g., RBER) in order to determine whether the sensed data can be successfully decoded or a read voltage adjustment and a subsequent new read strobe are needed. This sequence of calibration and read operations can be iteratively performed until either the sensed data is successfully decoded or a predefined maximum number of steps has been performed. In another embodiment, the memory device 130 could perform the adjustment itself, possibly at the cost of a longer read latency.

Responsive to determining that the block 310 is in the uniform charge loss state, at operation 220, the processing logic can perform the read operation to read the requested data from block 310 using uniform charge loss compensation techniques. For example, the processing logic can use the dynamic pass-through voltage ($V_{pass}R$), as described above, or can use a charge bucket classifier (CBC) index value maintained by the system to determine corresponding read level offsets for the read operation. Based on the amount of time for which the block 310 was open (i.e., the difference between when last wordline was written and the first wordline was written, also referred to herein as the "time to close"), charge loss tracking component 113 can identify a corresponding CBC index value. Each CBC index value can be associated with a respective range of time to close values for the block 310, and can have associated defined read level offset values. The CBC index value can be part of a set of predetermined offsets for each level. As the charge loss increases, a higher CBC value (or index) can be chosen to apply larger read level offsets. Thus, charge loss tracking component 113 can determine the corresponding read level offset values and adjust the read level voltage(s) used to perform the read operation on block 310 accordingly.

Figure 4:
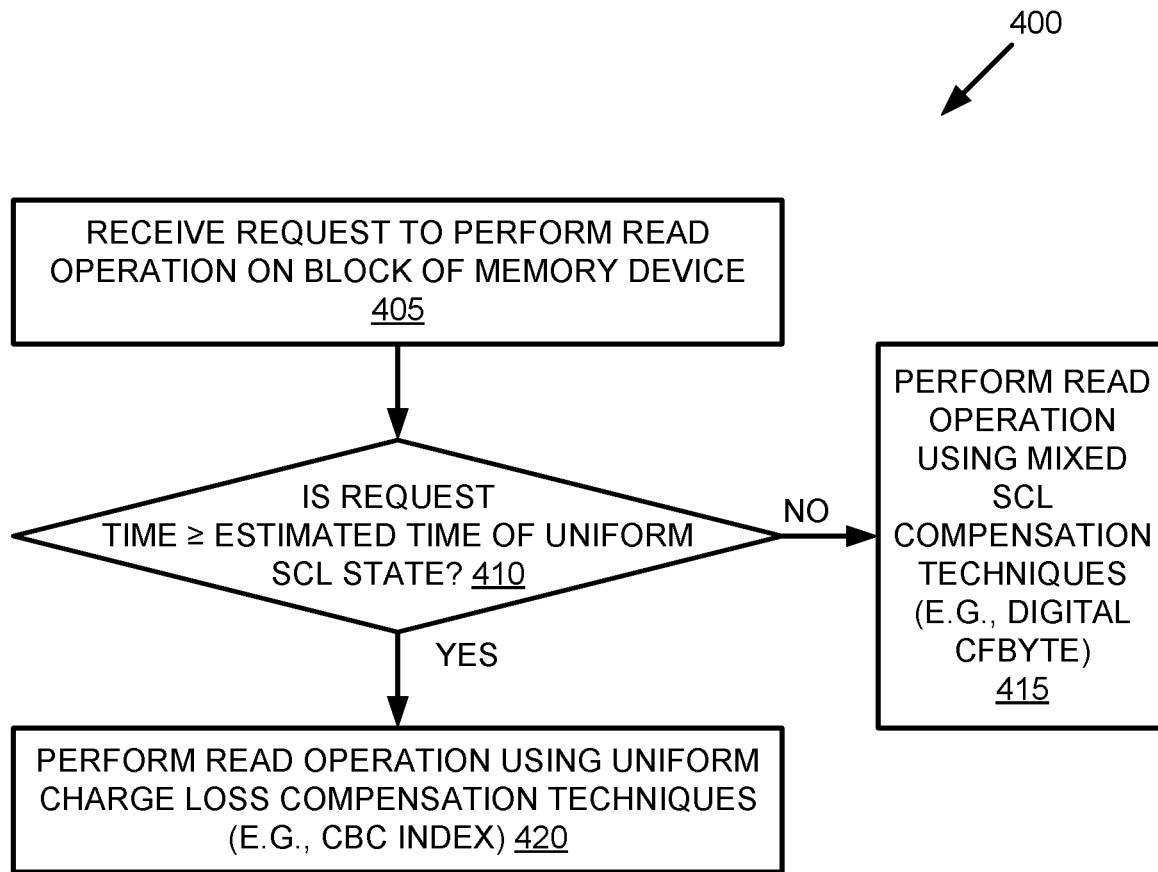
FIG. 4 is a flow diagram of an example method of processing a request to perform a read operation using a temperature-compensated time estimate for when a block will reach a uniform charge loss state in accordance with some embodiments of the present disclosure.

FIG. 4 is a flow diagram of an example method of processing a request to perform a read operation using a temperature-compensated time estimate for when a block will reach a uniform charge loss state in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by charge loss tracking component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing logic (e.g., charge loss tracking component 113) receives, from a requestor, a request to perform a read operation to read data from a memory device, such as memory device 130. In one embodiment, memory sub-system controller 115 receives the request from host system 120 or from some other component connected to or within memory sub-system 110. The request may identify data to be read from memory device 130 of memory sub-system 110, such as a particular page of data in a segment (e.g., block 310) of memory device 130.

At operation 410, the processing logic determines whether the block 310 to which the read operation is directed is in a uniform charge loss state. In one embodiment, the processing logic can use a temperature compensated amount of time for which the block 310 was open to predict when the block 310 will reach the uniform charge loss state. In one embodiment, the processing logic determines whether a time associated with the request to perform the read operation is greater than or equal to the temperature compensated time estimate of when the block will reach a uniform charge loss state. Additional details with respect to how the temperature compensated time estimate are provided below with respect to FIG. 5.

Responsive to determining that the time associated with the request to perform the read operation is less than the estimate of when the block will reach the uniform charge loss state, at operation 415, the processing logic can determine that block 310 has not reached the uniform charge loss state and can perform the read operation to read the requested data from block 310 using mixed SCL compensation techniques.

Responsive to determining that the time associated with the request to perform the read operation is greater than or equal to the estimate of when the block will reach the uniform charge loss state, at operation 220, the processing logic can determine that block 310 has reached the uniform charge loss state and can perform the read operation to read the requested data from block 310 using uniform charge loss compensation techniques.

Figure 5:
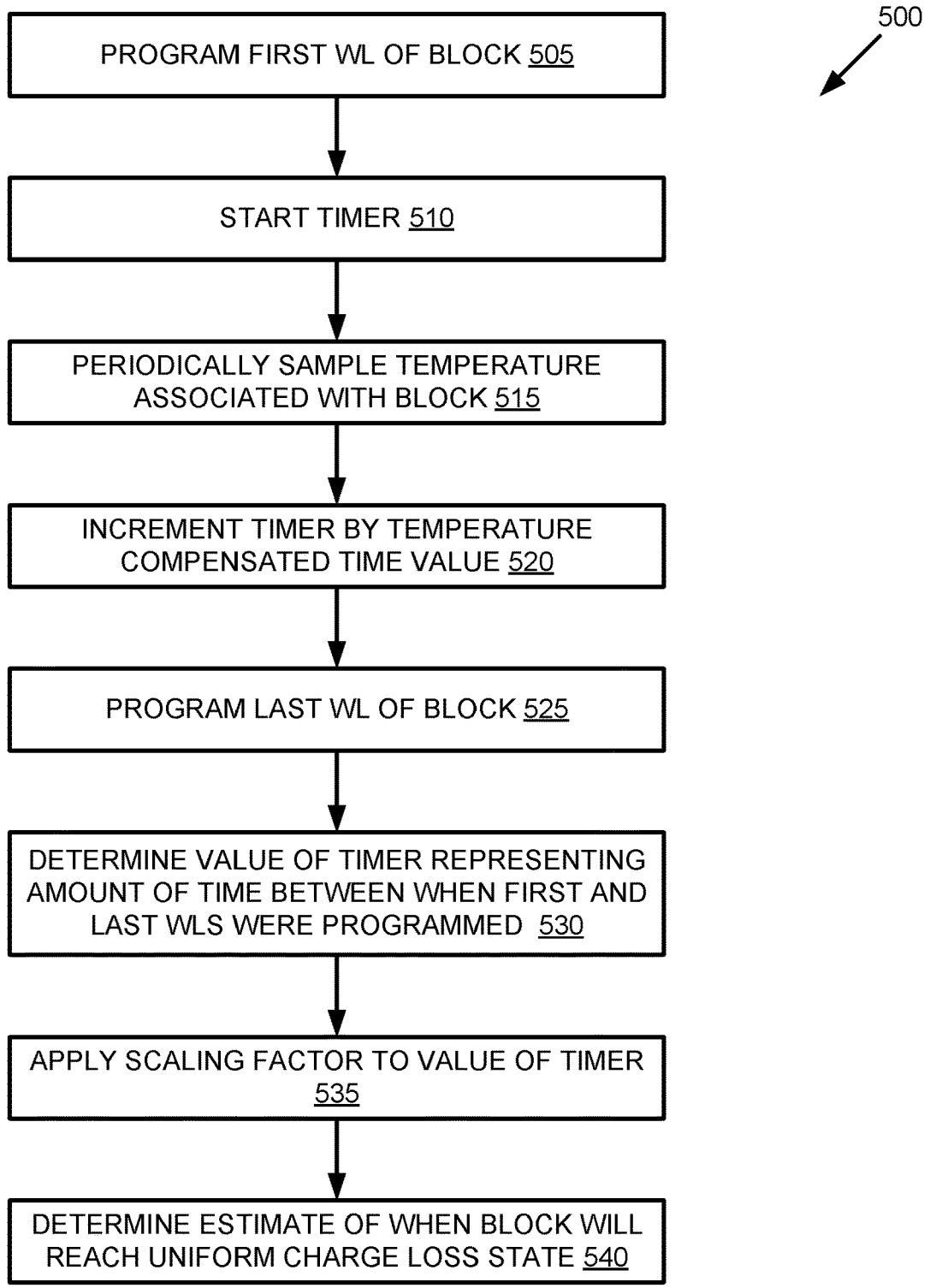
FIG. 5 is a flow diagram of an example method of determining a temperature-compensated time estimate for when a block will reach a uniform charge loss state in accordance with some embodiments of the present disclosure.

FIG. 5 is a flow diagram of an example method of determining a temperature-compensated time estimate for when a block will reach a uniform charge loss state in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by charge loss tracking component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing logic programs a first wordline of a segment, such as block 310, of a memory device, such as memory device 130. In one embodiment, all of the memory cells associated with all of the wordlines of memory device 130 can initially be in an erased state. In response to a request, from host system 120 for example, memory sub-system controller 115 can issue a program command to memory device 130 to cause certain data to be programmed to block 310. In one embodiment, the first wordline could include a wordline on which data corresponding to page 322-1 is written.

At operation 510, the processing logic starts a timer or counter in response to the first wordline of block 310 being programmed. In one embodiment, charge loss tracking component 113 maintains a separate counter for each segment (e.g., block) of memory device 130 to track the period of time for which the corresponding segment is open (i.e., the period of time between when the first wordline is programmed and when the last wordline is programmed). In one embodiment, the counter is initiated to a default value (e.g., zero) periodically incremented as described below.

At operation 515, the processing logic monitors a temperature associated with block 310. In one embodiment, charge loss tracking component 113 captures periodic samples of the temperature after the memory cells associated with the first wordline of the plurality of wordlines of the block were written. For example, memory device 130 can have an associated temperature sensor (e.g., an on-die sensor), or memory sub-system 110 can have an associated temperature sensor (e.g., a system-level sensor). In one embodiment, charge loss tracking component 113 determines an average temperature of the memory device during a certain period of time, such as the period between defined intervals, or the between when the memory cells associated with the first wordline of the plurality of wordlines of the block were written and when the memory cells associated with the last wordline of the plurality of wordlines of the block were written.

At operation 520, the processing logic increments the timer or counter by a temperature compensated time value targeting a common reference temperature. In one embodiment, the temperature compensated time value is based on an Arrhenius approximation. Since the level and/or rate or charge loss experienced by the memory cells in block 310 will vary with respect to the temperature, the Arrhenius equation can be used to normalize the amount of time between intervals. For example, if at a certain default temperature, a certain amount of charge loss can be expected in a given amount of time, in general at higher temperatures, a higher amount of charge loss can be expected in the same amount of time. Similarly, at lower temperatures, a lower amount of charge loss can be expected in that same amount of time. Accordingly, the Arrhenius approximation can be used to determine what an equivalent amount of time that would have passed at the default temperature to represent the same amount of charge loss that actually occurred given the higher or lower temperature experienced by the memory device. Accordingly, rather than incrementing the timer based on the regular amount of time that has passed, charge loss tracking component can instead increment the timer by the temperature compensated time value representing how much time would have passed at the default temperature in order for the same amount of charge loss to have occurred. The Arrhenius equation is shown herein as Equation 1:

$$\text{time2} = \text{time1} * e^{\left[\left(\frac{ActivationE}{BoltzC}\right)*\left(\frac{1}{temp0} - \frac{1}{temp1}\right)\right]} \quad (1)$$

The equation can be used to calculate time2, which is the temperature compensated time value by which the timer or counter associated with block 310 can be incremented. The value time1 is a reference time which represents the interval at which the temperature is sampled. The value ActivationE is the activation energy associated with memory device 130, and BoltzC is the Boltzmann constant. The value temp0 is a reference temperature (e.g., room temperature) and the value temp1 is the sampled temperature (or average temperature during the interval) determined at operation 515. In one embodiment, the calculations using the Arrhenius can be performed in advance, with the resulting temperature compensated time values stored in a data structure, such as a look-up table, in system memory (e.g., local memory 119). Accordingly, upon identifying the temperature at operation 515, charge loss tracking component 113 can identify a corresponding entry in the data structure associated with that temperature and including the temperature compensated time value. In other embodiments, some other normalization process can be used.

At operation 525, the processing logic programs a last wordline of the segment, such as block 310, of the memory device, such as memory device 130. In one embodiment, the last wordline could include a wordline on which data corresponding to page 322-n is written.

At operation 530, the processing logic determines a value of the timer when the memory cells associated with the last wordline of the plurality of wordlines of the block are written. Since the timer was incremented using temperature compensated time values, the value of the timer will represent an amount of time that has been normalized according to the temperature associated with the block.

At operation 535, the processing logic applies a scaling factor to the value of the timer. In one embodiment, the scaling factor is a predetermined value that represents how long it is expected for the block 310 to reach a uniform charge loss stated in view of the temperature compensated amount of time between when memory cells associated with a first wordline of the plurality of wordlines of the block were written and when memory cells associated with a last wordline of the plurality of wordlines of the block were written. In one embodiment, the scaling factor could be variable based on a characterization of the block 310 (e.g., the scaling factor could vary according to a number of program/erase cycles performed on the block).

At operation 540, the processing logic determines, based at last in part on the amount of time between when memory cells associated with a first wordline of the plurality of wordlines of the block were written and when memory cells associated with a last wordline of the plurality of wordlines of the block were written and on an associated scaling factor, an estimate of when the block 310 will reach a uniform charge loss state.

Figure 6:
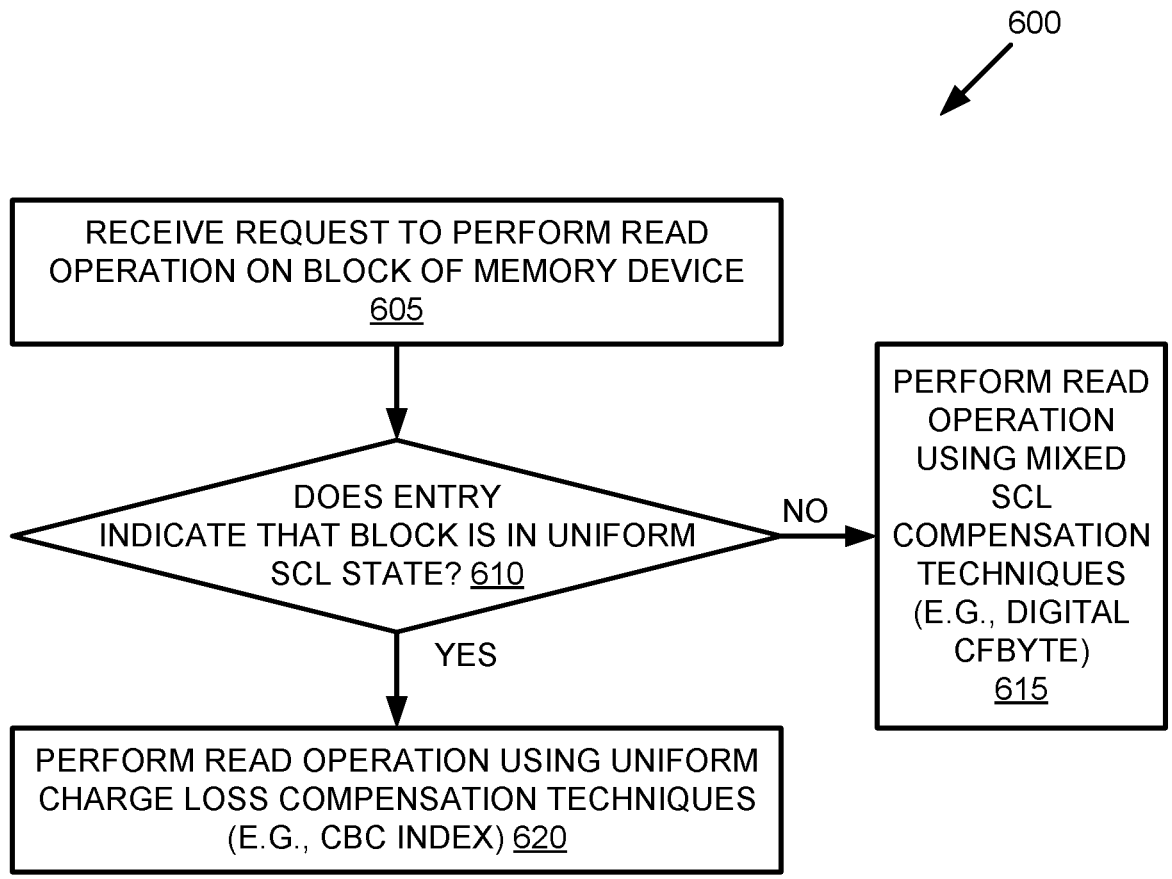
FIG. 6 is a flow diagram of an example method of processing a request to perform a read operation using measured representative charge losses to determine if a block is in a uniform charge loss state in accordance with some embodiments of the present disclosure.

FIG. 6 is a flow diagram of an example method of processing a request to perform a read operation using measured representative charge losses to determine if a block is in a uniform charge loss state in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by charge loss tracking component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 605, the processing logic (e.g., charge loss tracking component 113) receives, from a requestor, a request to perform a read operation to read data from a memory device, such as memory device 130. In one embodiment, memory sub-system controller 115 receives the request from host system 120 or from some other component connected to or within memory sub-system 110. The request may identify data to be read from memory device 130 of memory sub-system 110, such as a particular page of data in a segment (e.g., block 310) of memory device 130.

At operation 610, the processing logic accesses an entry associated with the block 310 in a data store, such as a database or other data structure maintained by charge loss tracking component 113 on the memory sub-system controller 115 (e.g., in local memory 119). In one embodiment, the data store includes a number of entries, where each entry is associated with a respective block or other segment of memory device 130. In one embodiment, the accessed entry includes an indication of whether the block 310 is in a uniform charge loss state or a mixed SCL state. Such an indication can be determined and recorded by charge loss tracking component 113 based on whether a difference between respective levels of charge loss associated with a first representative wordline of a block of a memory device and with a second representative wordline of the block of the memory device satisfies a threshold criterion. Additional details with respect to how the indication of the charge loss state is determined using measurements of the representative charge loss are below with respect to FIG. 7.

Responsive to the entry associated with block 310 indicating that block 310 is not in the uniform charge loss state, at operation 615, the processing logic can perform the read operation to read the requested data from block 310 using mixed SCL compensation techniques.

Responsive to the entry associated with block 310 indicating that block 310 is in the uniform charge loss state, at operation 620, the processing logic can perform the read operation to read the requested data from block 310 using uniform charge loss compensation techniques.

Figure 7:
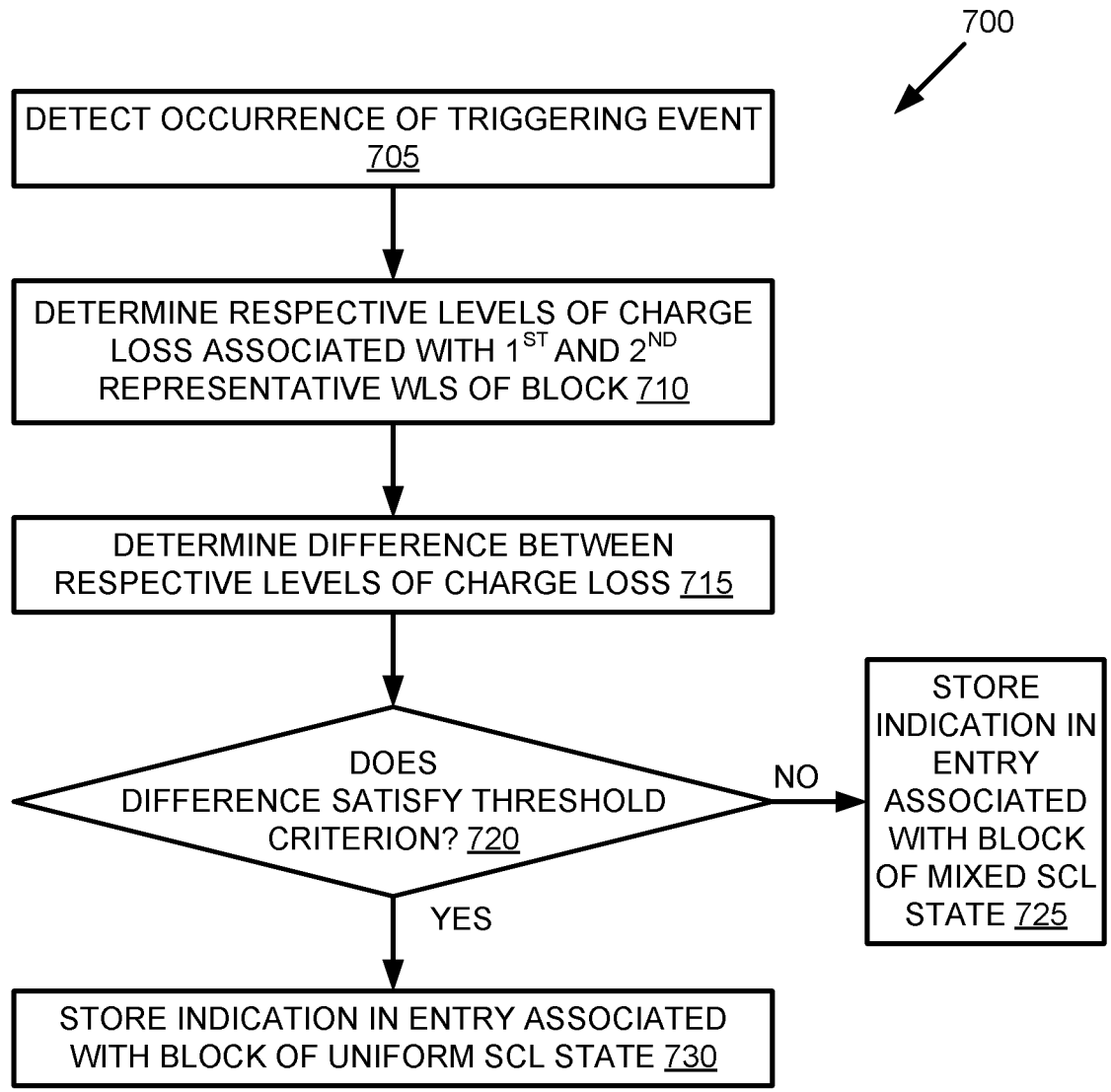
FIG. 7 is a flow diagram of an example method of measuring representative charge losses to determine if a block is in a uniform charge loss state in accordance with some embodiments of the present disclosure.

FIG. 7 is a flow diagram of an example method of measuring representative charge losses to determine if a block is in a uniform charge loss state in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by charge loss tracking component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 705, the processing logic detects an occurrence of a triggering event. Depending on the embodiment, the triggering event can include the expiration of a periodic interval, the occurrence of a power cycle event in the memory sub-system 110, or some other triggering event. For example, charge loss tracking component 113 can maintain a timer or counter that is set to a certain value and counts down to zero or counts up from zero to the certain value. The expiration of that timer or counter could be the occurrence of the triggering event, and charge loss tracking component 113 can reset the timer or counter to the initial value. In addition, charge loss tracking component 113 can detect a power cycle event, such as the temporary loss of power to at least one of memory device 130, memory sub-system controller 115, or memory sub-system 110 as a whole, which is later restored so that operations can resume. Such a power cycle event could be the occurrence of the triggering event.

At operation 710, the processing logic determines respective levels of charge loss and/or rates of charge loss associated with a first representative wordline of block 310 of memory device 130 and with a second representative wordline of the block 310. In one embodiment, the first representative wordline comprises a first wordline of the block 310 for which associated memory cells were written. For example, the first representative wordline could include a wordline on which data corresponding to page 322-1 was written. In one embodiment, the second representative wordline comprises a last wordline of the block 310 for which associated memory cells were written. For example, the second representative wordline could include a wordline on which data corresponding to page 322-$n$ was written. In other embodiments, the representative wordlines include more than a single wordline, such a group or set of wordlines. In other embodiments, the representative wordlines are not necessary the very first and/or very last wordline for which associated memory cells were written. For example, the first and second representative wordlines could respectively include any wordline within a threshold number of wordlines of the start or end of the block. To determine the respective levels and/or rates of charge loss associated with the first and second representative wordlines, charge loss tracking component 113 can test the CFByte value of the first and last wordlines. In another embodiment, charge loss tracking component 113 can measure the actual charge loss with a read sample offset iterative approach (e.g., left, right, and center measurements repeated with adjusted offsets until the right and left samples show the same error count). For each repeated measurement, charge loss tracking component 113 can move the read level in the direction determined by the left or right magnitude (e.g., if the left is greater than the right, move the read level to the right). Charge loss tracking component 113 can compare the movement to a known reference, where the difference defines the charge loss magnitude.

At operation 715, the processing logic the processing logic determines a difference between the respective levels of charge loss. For example, charge loss tracking component 113 can subtract the lower level or rate of charge loss from the higher level or rate of charge loss. In general, memory cells that have been programmed for a longer period of time can expect to see higher levels and/or rates of charge loss, so generally charge loss tracking component 113 can subtract the level and/or rate of charge loss associated with the second representative wordline from that of the first representative wordline.

At operation 720, the processing logic determines whether the difference between the respective levels of charge loss satisfies a threshold criterion. In one embodiment, the difference between the respective levels of charge loss satisfies the threshold criterion when the difference between the respective levels of charge loss is less than a threshold amount. For example, charge loss tracking component 113 can compare the difference between the respective levels of charge loss to the threshold amount to determine if the difference is less than the threshold amount. If the difference is less than the threshold amount, charge loss tracking component 113 can determine that the respective levels of charge loss have converged over time, such that the block 310 is in the uniform charge loss state. If the difference is greater than or equal to the threshold amount, however, charge loss tracking component 113 can determine that the threshold criterion is not satisfied and that the block 310 is in the mixed SCL state.

Responsive to determining that the difference between the respective levels of charge loss does not satisfy the threshold criterion, the processing logic can determine that the block 310 is not in a uniform charge loss state and, at operation 725 can store an indication in the entry of the data store associated with the block 310 of the mixed SCL state. Responsive to determining that the difference between the respective levels of charge loss does satisfy the threshold criterion, the processing logic can determine that the block 310 is in a uniform charge loss state and, at operation 730 can store an indication in the entry of the data store associated with the block 310 of the uniform charge loss state.

Figure 8:
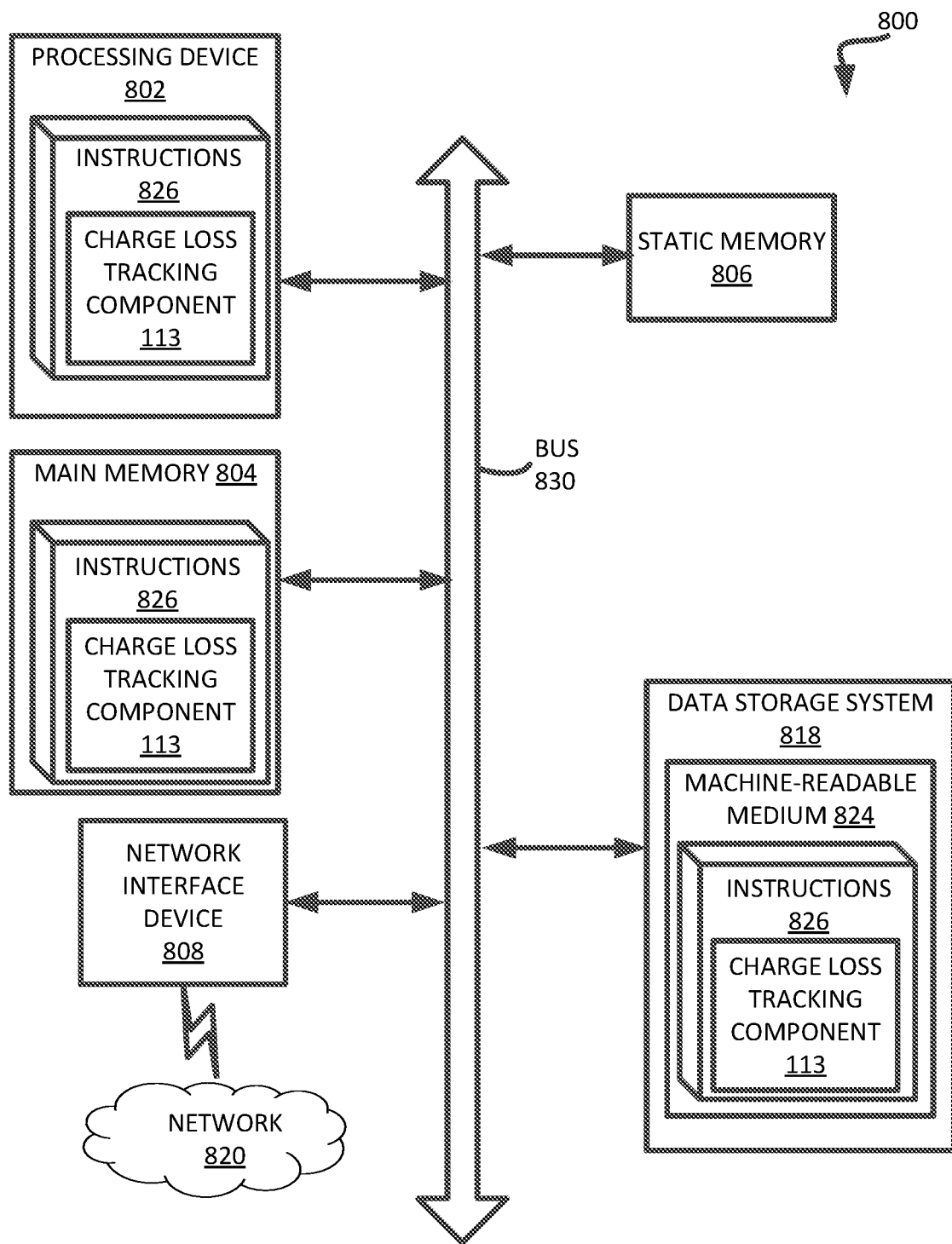
FIG. 8 is a block diagram of an example computer system in which embodiments of the present disclosure may operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the charge loss tracking component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to the charge loss tracking component 113 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
detecting an occurrence of a triggering event;
determining respective levels of charge loss associated with a first representative wordline of a block of the memory device and with a second representative wordline of the block of the memory device;
determining whether a difference between the respective levels of charge loss satisfies a threshold criterion; and
responsive to determining that the difference between the respective levels of charge loss satisfies the threshold criterion, determining that the block is in a uniform charge loss state.

2. The system of claim 1, wherein detecting the occurrence of the triggering event comprises detecting an expiration of a periodic interval.

3. The system of claim 1, wherein detecting the occurrence of the triggering event comprises detecting the occurrence of a power cycle event in the system.

4. The system of claim 1, wherein the first representative wordline comprises a first wordline of the block for which associated memory cells were written, and wherein the second representative wordline comprises a last wordline of the block for which associated memory cells were written.

5. The system of claim 1, wherein the difference between the respective levels of charge loss satisfies the threshold criterion when the difference between the respective levels of charge loss is less than a threshold amount.

6. The system of claim 1, wherein the processing device is to perform operations further comprising:
receiving a request to perform a read operation on the block of the memory device; and
responsive to determining that the block is in the uniform charge loss state, performing the read operation on the block using a uniform charge loss compensation technique.

7. The system of claim 1, wherein the processing device is to perform operations further comprising:
responsive to determining that the difference between the respective levels of charge loss does not satisfy the threshold criterion, determining that the block is not in a uniform charge loss state.

8. The system of claim 7, wherein the processing device is to perform operations further comprising:
receiving a request to perform a read operation on the block of the memory device; and
responsive to determining that the block is not in the uniform charge loss state, performing the read operation on the block using a mixed SCL compensation technique.

9. A method comprising:
detecting an occurrence of a triggering event;
determining respective levels of charge loss associated with a first representative wordline of a block of a memory device and with a second representative wordline of the block of the memory device;
determining whether a difference between the respective levels of charge loss satisfies a threshold criterion; and
responsive to determining that the difference between the respective levels of charge loss satisfies the threshold criterion, determining that the block is in a uniform charge loss state.

10. The method of claim 9, wherein detecting the occurrence of the triggering event comprises detecting an expiration of a periodic interval.

11. The method of claim 9, wherein detecting the occurrence of the triggering event comprises detecting the occurrence of a power cycle event in the system.

12. The method of claim 9, wherein the first representative wordline comprises a first wordline of the block for which associated memory cells were written, and wherein the second representative wordline comprises a last wordline of the block for which associated memory cells were written.

13. The method of claim 9, wherein the difference between the respective levels of charge loss satisfies the threshold criterion when the difference between the respective levels of charge loss is less than a threshold amount.

14. The method of claim 9, wherein the processing device is to perform operations further comprising:
receiving a request to perform a read operation on the block of the memory device; and
responsive to determining that the block is in the uniform charge loss state, performing the read operation on the block using a uniform charge loss compensation technique.

15. The method of claim 9, wherein the processing device is to perform operations further comprising:
responsive to determining that the difference between the respective levels of charge loss does not satisfy the threshold criterion, determining that the block is not in a uniform charge loss state.

16. The method of claim 15, wherein the processing device is to perform operations further comprising:

receiving a request to perform a read operation on the block of the memory device; and responsive to determining that the block is not in the uniform charge loss state, performing the read operation on the block using a mixed SCL compensation technique.

17. A non-transitory computer-readable storage medium comprising instructions that, when executed by a processing device, cause the processing device to perform operations comprising:

receiving a request to perform a read operation on a block of a memory device;

accessing an entry associated with the block in a data store, the entry comprising an indication of whether the block is in a uniform charge loss state, wherein the indication is based on whether a difference between respective levels of charge loss associated with a first representative wordline of a block of a memory device and with a second representative wordline of the block of the memory device satisfies a threshold criterion; and responsive to the entry indicating that the block is in a uniform charge loss state, performing the read operation on the block using a uniform charge loss compensation technique.

18. The non-transitory computer-readable storage medium of claim 17, wherein the first representative wordline comprises a first wordline of the block for which associated memory cells were written, and wherein the second representative wordline comprises a last wordline of the block for which associated memory cells were written.

19. The non-transitory computer-readable storage medium of claim 17, wherein the difference between the respective levels of charge loss satisfies the threshold criterion when the difference between the respective levels of charge loss is less than a threshold amount.

20. The non-transitory computer-readable storage medium of claim 17, wherein the instructions cause the processing device to perform operations further comprising:

responsive to the entry indicating that the block is not in the uniform charge loss state, performing the read operation on the block using a mixed SCL compensation technique.

* * * * *